United States Patent
Clarke

(10) Patent No.: US 11,474,372 B2
(45) Date of Patent: Oct. 18, 2022

(54) LATERALLY OFFSET PARALLAX BARRIERS IN MULTI-VIEW DISPLAY

(71) Applicant: Samsung Electronics Company, Ltd., Suwon-si (KR)

(72) Inventor: Nigel A. Clarke, Mountain View, CA (US)

(73) Assignee: Samsung Electronics Company, Ltd., Suwon-si (KR)

(*) Notice: Subject to any disclaimer, the term of this patent is extended or adjusted under 35 U.S.C. 154(b) by 0 days.

(21) Appl. No.: 17/125,693

(22) Filed: Dec. 17, 2020

(65) Prior Publication Data
US 2022/0026734 A1 Jan. 27, 2022

Related U.S. Application Data

(60) Provisional application No. 63/054,893, filed on Jul. 22, 2020.

(51) Int. Cl.
*G02B 30/32* (2020.01)
*H04N 13/31* (2018.01)
*H01L 27/32* (2006.01)
*G02F 1/1368* (2006.01)

(52) U.S. Cl.
CPC .............. *G02B 30/32* (2020.01); *H04N 13/31* (2018.05); *G02F 1/1368* (2013.01); *H01L 27/3244* (2013.01)

(58) Field of Classification Search
CPC ...... G02B 30/32; H04N 13/31; G02F 1/1368; H01L 27/3244
USPC ........................................................ 348/54
See application file for complete search history.

(56) References Cited

U.S. PATENT DOCUMENTS

| | | | |
|---|---|---|---|
| 7,619,815 B2 | 11/2009 | Nam | |
| 7,782,409 B2 | 8/2010 | Kean | |
| 7,957,060 B2* | 6/2011 | Mashitani | G02B 30/27 359/462 |
| 8,711,478 B2* | 4/2014 | Yanamoto | H04N 13/324 359/464 |
| 9,432,658 B2 | 8/2016 | Usukura | |
| 10,142,617 B2* | 11/2018 | Wu | H04N 13/315 |

(Continued)

FOREIGN PATENT DOCUMENTS

| | | |
|---|---|---|
| JP | 4483181 | 6/2010 |
| KR | 2012-0122859 | 11/2012 |
| WO | WO 2012-030092 | 3/2012 |

OTHER PUBLICATIONS

Sharp Dual Direction Viewing LCDs https://global.sharp/products/device/about/lcd/dual/index.html, Downloaded from web Nov. 6, 2020.

*Primary Examiner* — Tung T Vo

(57) ABSTRACT

In one embodiment, an apparatus includes a multi-view display that includes several pixels. The apparatus includes a parallax barrier that overlays the several pixels of the multi-view display. The parallax barrier includes several barrier rows that are arrayed in a first dimension, where each barrier row includes several barriers arrayed in a second dimension. Each of the barriers are separated from adjacent barriers in the barrier row by an aperture. Each barrier row is offset from adjacent barrier rows by a macro offset distance in the second dimension. A portion of each barrier is offset by a micro offset distance in the second dimension, where the micro offset distance is smaller than the macro offset distance.

17 Claims, 14 Drawing Sheets

(56) References Cited

U.S. PATENT DOCUMENTS

| | | | |
|---|---|---|---|
| 10,194,143 B2* | 1/2019 | Kim | H04N 13/305 |
| 2007/0236792 A1* | 10/2007 | Mashitani | G02B 30/32 |
| | | | 359/462 |
| 2012/0229595 A1* | 9/2012 | Miller | H04N 13/167 |
| | | | 348/43 |
| 2014/0036047 A1* | 2/2014 | Watanabe | H04N 13/15 |
| | | | 348/54 |
| 2015/0043066 A1* | 2/2015 | Kikkawa | H04N 13/317 |
| | | | 359/463 |
| 2015/0130916 A1* | 5/2015 | Hamagishi | H04N 13/317 |
| | | | 348/59 |
| 2015/0228217 A1 | 8/2015 | Perdices-Gonzalez | |
| 2016/0142704 A1* | 5/2016 | Hamagishi | H04N 13/351 |
| | | | 348/59 |
| 2017/0033288 A1* | 2/2017 | Takahashi | H01L 51/0005 |
| 2017/0208319 A1* | 7/2017 | Kim | H04N 13/305 |
| 2017/0310956 A1 | 10/2017 | Perdices-Gonzalez | |

* cited by examiner

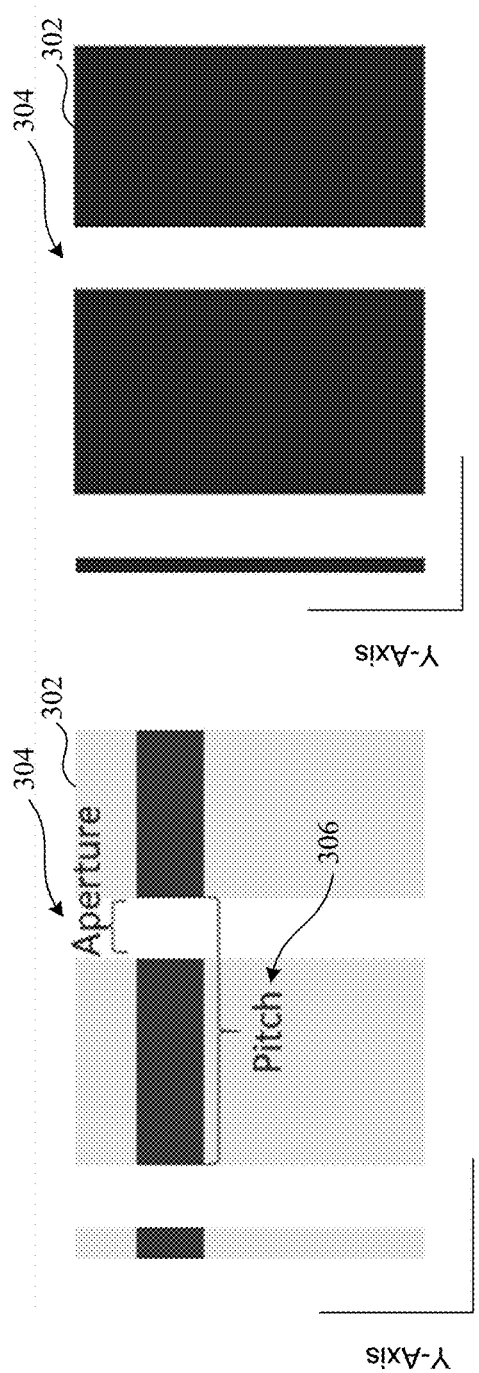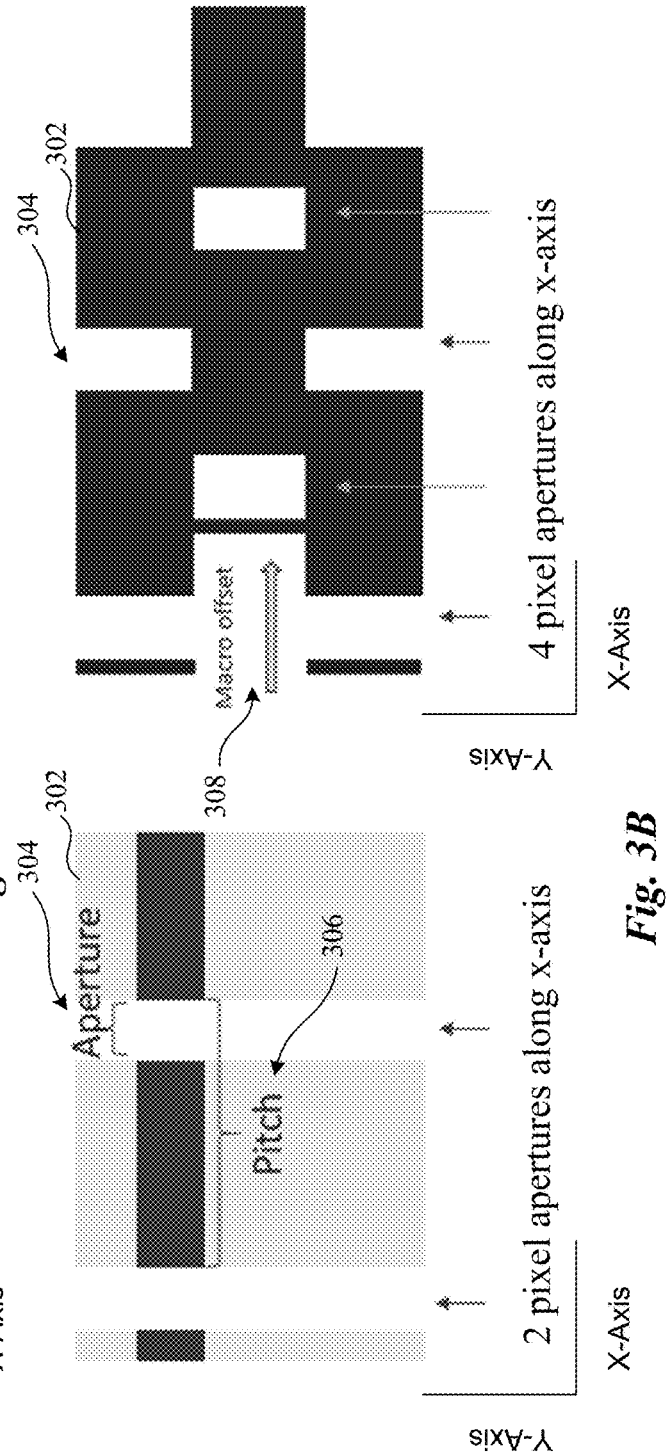
Fig. 3A
Fig. 3B

US 11,474,372 B2

LATERALLY OFFSET PARALLAX BARRIERS IN MULTI-VIEW DISPLAY

PRIORITY

This application claims the benefit under 35 U.S.C. § 119(e) of U.S. Provisional Patent Application No. 63/054,893, filed 22 Jul. 2020, which is incorporated herein by reference.

TECHNICAL FIELD

This disclosure relates generally to electronic display systems, and in particular relates to parallax barriers in multi-view display systems.

BACKGROUND

A parallax barrier is a device placed in front of an image source, such as a liquid crystal display, to allow it to show a stereoscopic or multiscopic image without the need for the viewer to wear 3D glasses. Placed in front of the normal LCD, it consists of an opaque layer with a series of precisely spaced slits, allowing each eye to see a different set of pixels, so creating a sense of depth through parallax in an effect similar to what lenticular printing produces for printed products and lenticular lenses for other displays.

BRIEF DESCRIPTION OF THE DRAWINGS

FIGS. 3A-3D illustrate example modifications of a standard parallax barrier.

DESCRIPTION OF EXAMPLE EMBODIMENTS

Figure 1:
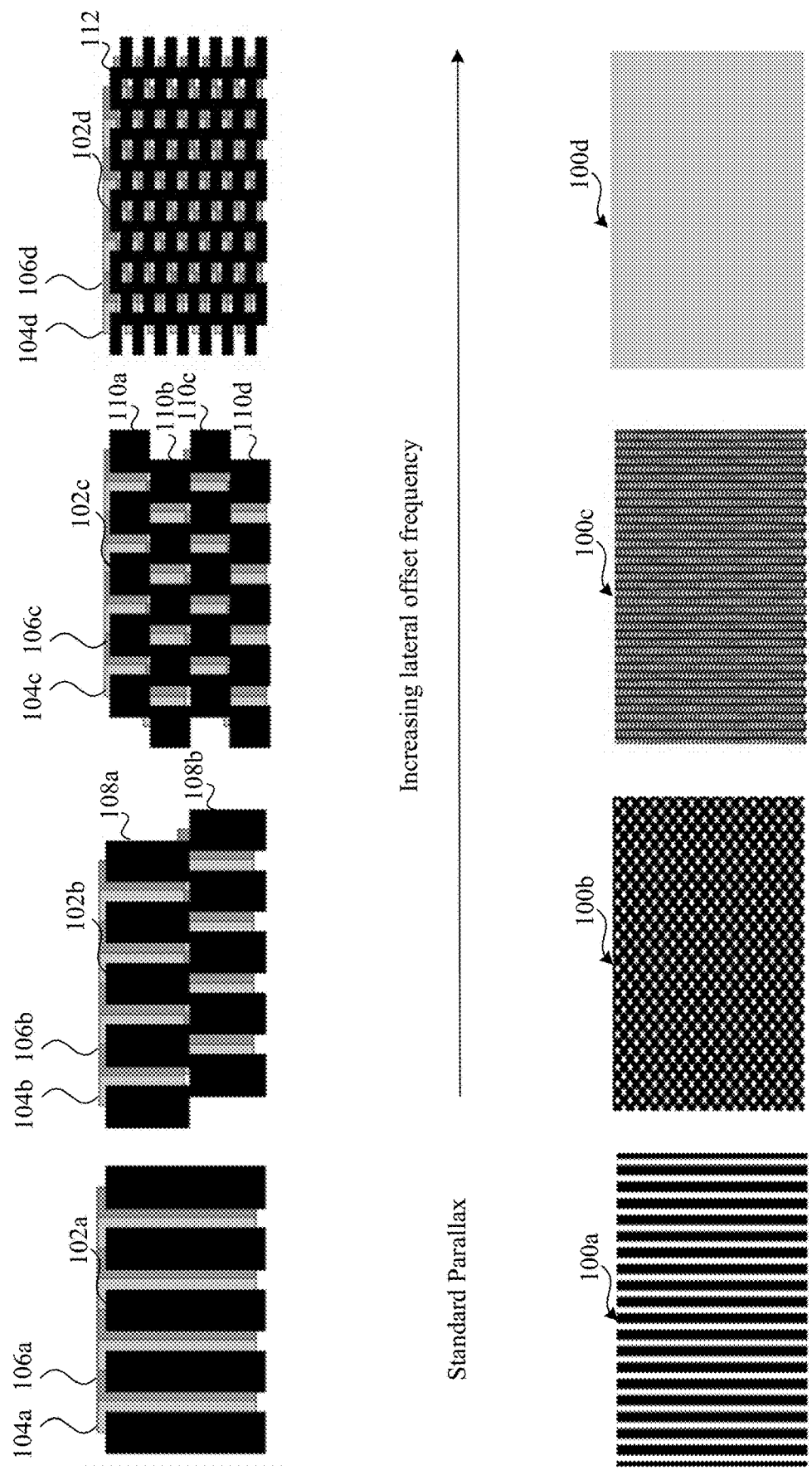
FIG. 1 illustrates example parallax barriers coupled to a multi-view display.

Parallax barriers have become a fundamental component that enables new display technologies including glasses-free three-dimensional (3D) displays and multi-view displays. However, currently many parallax barriers have losses in visual quality due to their structure. Traditional parallax barriers consist of a series of vertical lines, which can be noticeable to the user viewing the display coupled with the parallax barrier. The current structure of parallax barriers may cause RGB color banding from moiré effects and reduce image quality because the parallax barriers are noticeable. As such, a custom parallax barrier is needed to improve the image quality and reduce the color banding from moiré effects. To address these issues common to traditional parallax barriers, offsets may be incorporated into the standard parallax barrier to mitigate these issues. In particular embodiments, lateral offsets and guard barriers may be implemented into a parallax barrier. In particular embodiments, a multi-view display device may be customized to activate sets of pixels based on the positioning of the parallax barrier coupled to the multi-view display device. Although this disclosure describes particular parallax barriers applied or integrated into particular multi-view displays, this disclosure contemplates implementing any suitable parallax barrier in any suitable manner into any suitable type of display.

As mentioned herein, certain technical challenges exist for parallax barriers coupled to displays. One technical challenge may include reduced visibility and perceived resolution of a display when a parallax barrier is used. The solution presented by the embodiments disclosed herein to address this challenge may be to add a macro lateral offset that improves spatial blending and perceived X resolution of the multi-view display device. The perceived X resolution of the multi-view display device may correspond to the number of different pixels along the X-axis that are shown through the apertures of the parallax barrier. The X-axis and Y-axis may be defined relative to the parallax barrier. For a parallax barrier coupled to a multi-view display, the view may change as the user moves along the X-axis. While the view is described herein as changing along the X-axis, this disclosure contemplates that the view may also change along the Y-axis either instead of or in addition to the X-axis. Another technical challenge may include color banding and moiré effects that are introduced with a parallax barrier applied to a display. The solution presented by the embodiments disclosed herein to address this challenge may be micro lateral offsets that improves RGB blending and reduce moiré effects. Another technical challenge may include the off-axis cross talk when a parallax barrier is used for a display. The solution presented by the embodiments, disclosed herein to address this challenge may be guard bars to reduce off-axis cross talk and selectively deactivating pixels of the display.

Certain embodiments disclosed herein may provide one or more technical advantages. A technical advantage of the embodiments may include improved spatial blending and perceived X resolution. Another technical advantage of the embodiments may include improved RGB blending and reduced moiré effects. Yet another technical advantage of the embodiments may include reduction in off-axis cross talk. Certain embodiments disclosed herein may provide none, some, or all of the above technical advantages. One or more other technical advantages may be readily apparent to one skilled in the art in view of the figures, descriptions, and claims of the present disclosure.

In particular embodiments, an apparatus may display multiple visual content objects (e.g., images, videos, game elements, touch-screen elements, etc., hereinafter "content") on a multi-view display device. In particular embodiments, the apparatus may be embodied as a computing system that is coupled to or includes a multi-view display device. As an example and not by way of limitation, the apparatus may be a console of a vehicle that includes a multi-view display device. As another example and not by way of limitation, the apparatus may be a television that includes a multi-view display device. In particular embodiments, the multi-view display device may comprise a plurality of pixels. In particular embodiments, each of the plurality of pixels may comprise subpixels. As an example and not by way of limitation, a single pixel may comprise multiple subpixels that may be controlled individually. For instance, a single pixel may comprise a red subpixel, a green subpixel, and a blue subpixel, which may be individually addressed. While this disclosure may reference pixels, this disclosure may also reference subpixels instead. In particular embodiments, the apparatus may access a first content and a second content. As an example and not by way of limitation, the apparatus may determine what content to display to a first audience and what content to display to a second audience. In particular embodiments, a first user of the first audience may select the content to be displayed to the first audience, and a second user of the second audience may select the content to be displayed to the second audience. In particular embodiments, the apparatus may provide a plurality of options for a user to select content to display to the first audience and/or the second audience. In particular embodiments, the apparatus may store content in a storage to be accessed to present to the first audience and/or the second audience. As an example and not by way of limitation, the apparatus may have videos stored and access one or more videos to present to the first audience and/or second audience. In particular embodiments, the apparatus may interface one or more computing systems to access content to present to the first audience and/or the second audience. As an example and not by way of limitation, the apparatus may communicate with a server to stream content to the first audience and/or the second audience. In particular embodiments, one or more users may change either the first content and/or the second content at any time. As an example and not by way of limitation, a user may select another content to replace the first content, while the second content would remain the same. Although this disclosure describes accessing content in a particular manner, this disclosure contemplates accessing content in any suitable manner.

In particular embodiments, the apparatus may render a first content and a second content to be simultaneously displayed by a multi-view display device. In particular embodiments, the first content may be displayed by a first set of pixels of the multi-view display device. In particular embodiments, the second content may be displayed by a second set of pixels of the multi-view display device. The first set of pixels may be an exclusive set of the multi-view display device from the second set of pixels. Although this disclosure describes rendering content in a particular manner, this disclosure contemplates rendering content in any suitable manner.

In particular embodiments, the apparatus may display a first content and a second content at the multi-view display device. In particular embodiments, the multi-view display device may be coupled to an overlaying parallax barrier. In particular embodiments, the parallax barrier may comprise macro offsets between adjacent barrier rows. Each barrier row may comprise a plurality of barriers with micro offsets within each barrier. In particular embodiments, the first content may be viewable at a first angle from the multi-view display device. In particular embodiments, the second content may be viewable at a second angle from the multi-view display device. The first angle and the second angle may be different so that two users may view different content by standing on opposite sides of a multi-view display device. In particular embodiments, the apparatus may turn off one or more pixels of the first set of pixels or the second set of pixels based on the locations of the pixels relative to the plurality of barriers in each barrier row and the plurality of guard barriers in between each of the barrier rows. The turning off of pixels may help reduce off-axis cross talk. In particular embodiments, the apparatus may include software (installed or downloaded) that provides information indicative of the configuration of the parallax barrier with respect to the pixels of the multi-view display device. Although this disclosure describes displaying content in a particular manner, this disclosure contemplates displaying content in any suitable manner.

In particular embodiments, the parallax barrier may comprise a plurality of barrier rows arrayed in a first dimension. As used herein, the term "rows arrayed" in a particular dimension means that if a plurality of parallel rows run along, for example, the X-axis, then the rows are stacked (i.e., arrayed), for example, in the Y-axis. In other words, in a typical grid with rows and columns, where the rows run along the X-axis and the columns run down the Y-axis, the rows would be considered arrayed (i.e., stacked) in the Y-axis, and the columns would be considered arrayed in the X-axis. As an example and not by way of limitations, the parallax barrier may comprise a plurality of barrier rows that are arrayed along the Y-axis. In particular embodiments, each barrier row may comprise a plurality of barriers arrayed in a second dimension. As an example and not by way of limitation, each barrier row may comprise a plurality of barriers that are arrayed along the X-axis. In particular embodiments, each barrier may be separated from adjacent barriers in the barrier row by an aperture. In particular embodiments, each barrier row may be offset from adjacent barrier rows by a macro offset distance in a second dimension. As an example and not by way of limitation, each barrier row may be offset from adjacent barrier rows by a macro offset distance along the X-axis. That is, a barrier row may be shifted to the right along the X-axis so that it is offset from adjacent barrier rows by a macro offset distance. In particular embodiments, a portion of each barrier may be offset by a micro offset distance in the second dimension. As an example and not by way of limitation, a portion of each barrier may be offset by a micro offset distance along the X-axis. That is a portion of the barrier may be shifted to the right along the X-axis. In particular embodiments, the parallax barrier may comprise a plurality of guard barriers in between each of the barrier rows. The guard barriers may extend parallel to the plurality of barrier rows in the second dimension. In particular embodiments, the plurality of barrier rows arrayed in the first dimension and each barrier row arrayed in the second dimension may create a pattern of apertures that causes underlying pixels to produce a uniform light throughout the pattern of apertures. Although this disclosure describes a parallax barrier in a particular manner, this disclosure contemplates a parallax barrier in any suitable manner.

In particular embodiments, the guard barrier in between each barrier row may be configured to reduce off-axis cross talk between underlying pixels in adjacent rows. In particular embodiments, macro offset distance may be configured to provide spatial blending across a first content and a second content displayed on the multi-view display device. In particular embodiments, the micro offset distance may be configured to cause a distribution of color associated with the plurality of pixels of the multi-view display device to reduce color banding and reduce moiré effects caused by the parallax barrier.

In particular embodiments, the parallax barrier may be modified for each individual display. Given that various displays are manufactured differently (i.e., have different configurations), a corresponding parallax barrier may be customized to be applied onto the respective display and/or integrated into the display. In particular embodiments, the initial step to designing the parallax barrier may include defining a primary 1D parallax structure. The initial step may be based on the configuration of the display that the parallax barrier will be applied. The configuration of the display, such as locations of the pixels of the display, is used to define the primary 1D parallax structure. After defining the primary 1D parallax structure, a macro offset, micro offset, and guard regions are defined. The macro offset is defined by an offset to improve the spatial blending of the content and the perceived X resolution of the content. The micro offset is defined by an offset to improve RGB blending and reduce moiré effects. The guard bars are added in between the barrier rows to reduce off-axis cross talk. Specific software may be generated to enable the respective display, which the parallax barrier will be applied to, to disable pixels to reduce cross talk. The specific software for the display may be based on the configuration of the parallax barrier (e.g., the barriers, positions of guard bars, and offsets).

In particular embodiments, the parallax barrier may be made of a plurality of different materials. As an example and not by way of limitation, the parallax barrier may be made of one or more of silver halide, leuco dyes, amorphochromic dyes, liquid crystals, carbonization, thermochromics, metal oxides, viologens, electrochromics, phase change materials, photochromics, or other suitable materials. In particular embodiments, the material of the parallax barrier may be patterned with a laser plotter to define transparent and absorbing regions of the parallax barrier.

FIG. 1 illustrates example parallax barriers 100 coupled to a multi-view display. The multi-view display may be represented by portions 104, 106 that correspond to a first content 104 and a second content 106 that is displayed on the multi-view display. As shown in FIG. 1, an increase of lateral offset frequency is realized moving to the right through the example parallax barriers 100. In particular embodiments, the first parallax barrier 100a may be a standard parallax barrier with no offset between barrier rows. Each of the barrier rows of the first parallax barrier 100a may be arrayed (stacked) along a first dimension (i.e., Y-axis). The barriers 102a of the first parallax barrier 100a may be arrayed (stacked) along a second dimension (i.e., X-axis). In particular embodiments, the second parallax barrier 100b may comprise an offset between a first barrier row 108a and a second barrier row 108b. Similarly to the first parallax barrier 100a, the second parallax barrier 100b may have barrier rows 108 arrayed (stacked) along the first dimension (i.e., Y-axis) and the barriers 102b of the second parallax barrier 102b may be arrayed (stacked) along the second dimension (i.e., X-axis). The offset between the first barrier row 108a and a second barrier row 108b may be a macro offset along a second dimension (i.e., the X-axis). In particular embodiments, the third parallax barrier 100c may comprise a greater offset frequency than the second parallax barrier 100b. Similarly to the first parallax barrier 100a, the third parallax barrier 100c may have barrier rows 110 arrayed (stacked) along the first dimension (i.e., Y-axis) and the barriers 102c of the third parallax barrier 100c may be arrayed (stacked) along the second dimension (i.e., X-axis). The third parallax barrier 100c may comprise an offset between a first barrier row 110a and a second barrier row 110b along the second dimension (i.e., X-axis). The offset may be a macro offset along the second dimension (i.e., X-axis). The offset between the first barrier row 110a and a second barrier row 110b may be the same offset between the second barrier row 110b and a third barrier row 110c. In particular embodiments, the fourth parallax barrier 100d may comprise an offset frequency greater than the third parallax barrier 110c. Similarly to the first parallax barrier 100a, the fourth parallax barrier 100d may have barrier rows 112 arrayed (stacked) along the first dimension (i.e., Y-axis) and the barriers 102d of the fourth parallax barrier 100d may be arrayed (stacked) along the second dimension (i.e., X-axis). The fourth parallax barrier 100d may comprise a first barrier row 112a that is offset from a second barrier row 112b along the second dimension (i.e., X-axis). The offset between the first barrier row 112a and the second barrier row 112b may be a macro offset along the second dimension (i.e., X-axis). The pattern of offset barrier rows 112 may continue similarly as the third parallax barrier 100c. As the lateral offset frequency increases, the parallax barrier begins to blend together so it is less visible to a user.

Figure 2:
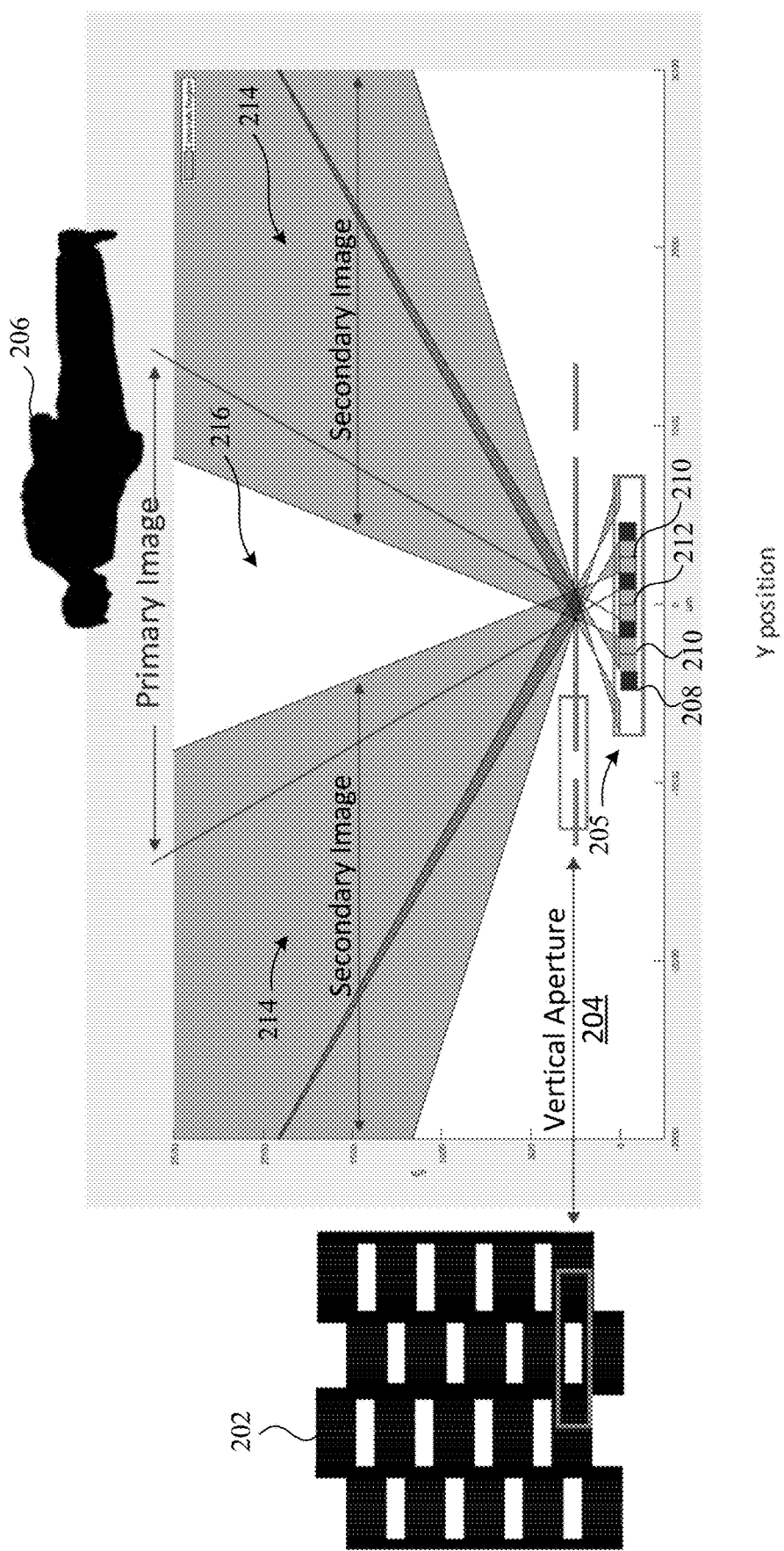
FIG. 2 illustrates an example view seen by a user viewing a multi-view display coupled a parallax barrier.

FIG. 2 illustrates an example view seen by a user 206 viewing a multi-view display 205 coupled to a parallax barrier 202. The parallax barrier 202 may comprise a plurality of apertures 204. A multi-view display 205 may comprise a plurality of pixels 210, 212. While only a set of pixels 210, 212 is shown, the multi-view display 205 may comprise pixels 210, 212 that extend in either direction of the Y-axis. Content from pixels 210, 212 of the multi-view display 205 may be shown through the apertures 204. In particular embodiments, the multi-view display 205 may comprise a plurality of turned off pixels 208. The multi-view display 205 may be configured to turn off pixels 208 to reduce off-axis cross talk. In particular embodiments, pixels 210 may correspond to the secondary image 214 shown to an audience of the multi-view display 205. In particular embodiments, pixels 212 may correspond to the primary image 216 presented to an audience of the multi-view display 205. In particular embodiments, the user 206 may be viewing the multi-view display 205 at a particular angle to see primary image 216. In portions where the secondary image 214 overlaps the primary image 216, the portions may contain cross talk.

Figure 3C:
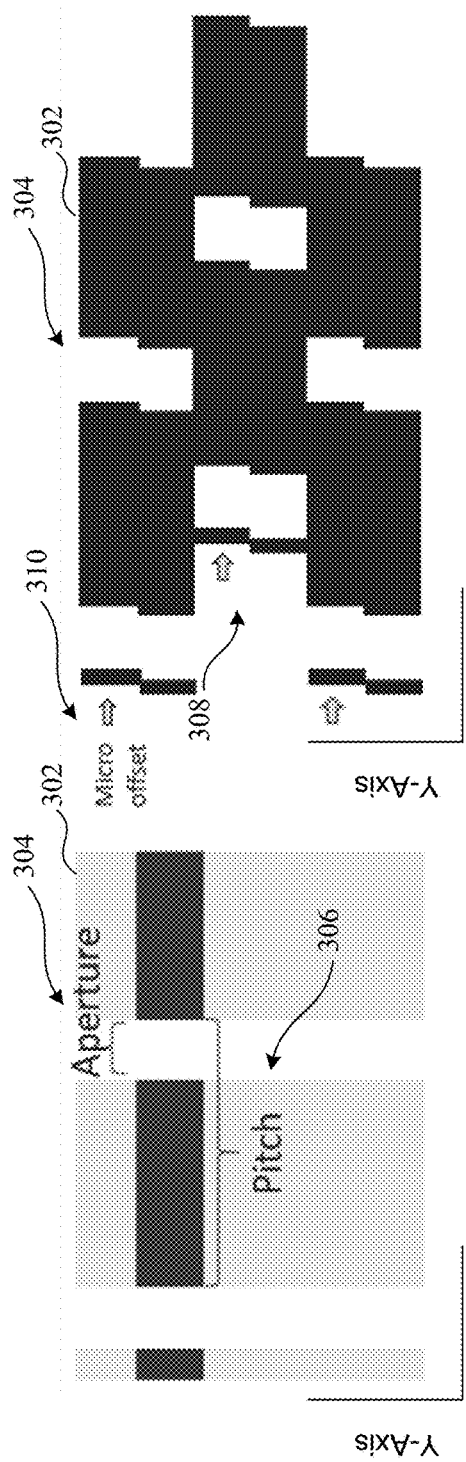
Figure 3D:
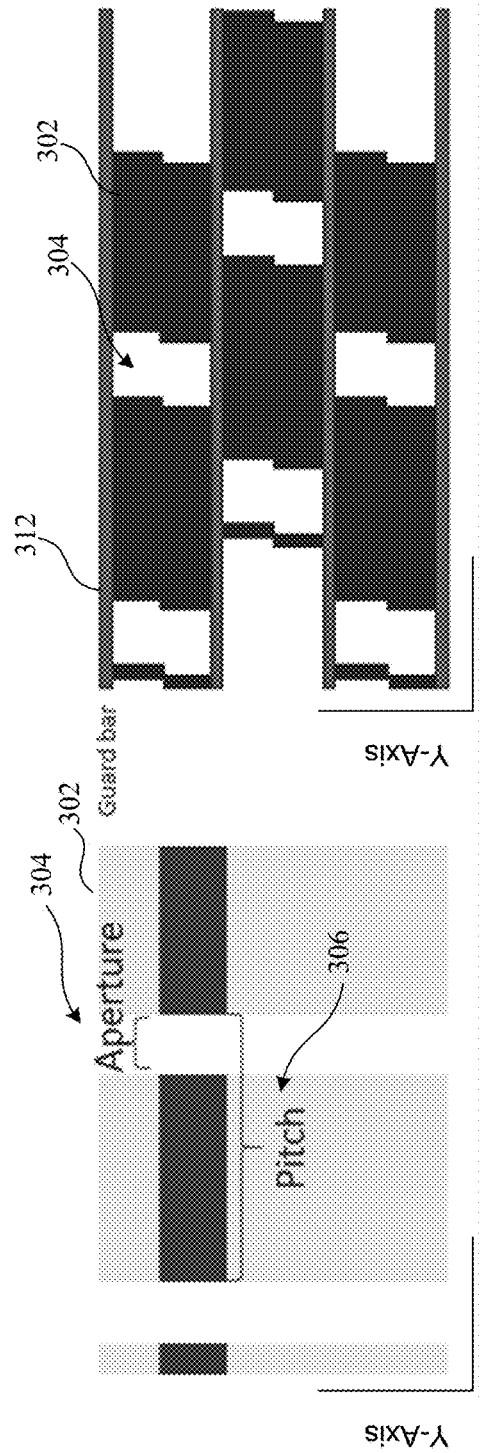

FIGS. 3A-3D illustrates example modifications of a standard parallax barrier. Referring to FIG. 3A, a standard parallax barrier 302 is shown for reference. The parallax barrier 302 may have apertures 304 between the barriers 302 of the parallax barrier 302. The parallax barrier 302 may include a pitch 306 which is includes the distance of a single barrier 302 with one aperture 304. In particular embodiments, the standard parallax barrier 302 shown in FIG. 3A may have barrier rows, one being shown by the darkened row, arrayed (stacked) along a first dimension (i.e., Y-axis). The standard parallax barrier 302 may have barriers 302 of the parallax barrier 302 arrayed (stacked) along a second dimension (i.e., X-axis). Referring to FIG. 3B, a parallax barrier 302 with a modification is shown. The parallax barrier 302 includes a macro offset 308 for a barrier row of the parallax barrier 302 along the second dimension (i.e., X-axis). The parallax barrier 302 with a modification is shown with three barrier rows arrayed (stacked) along the first dimension (i.e., Y-axis) and each barrier row having three barriers 302 (two whole barriers and a sliver of a third barrier) arrayed (stacked) along the second dimension (i.e., X-axis) The macro offset 308 shifts a barrier row of the parallax barrier 302 over by a macro offset distance along the second dimension (i.e., X-axis) as compared to the adjacent barrier rows that are above and below the offset barrier row. While previously, the parallax barrier 302 may have only 2 pixel apertures 304 along the X-axis, the parallax barrier 302 with the modification (e.g., macro offset 308) may have 4 pixel apertures 304 along the X-axis. The increase in pixel apertures along the X-axis may increase the X-resolution of the content being displayed through the parallax barrier 302 as compared to a traditional parallax barrier 302 (i.e., parallax barrier 302 with no macro offset 308). Referring to FIG. 3C, the parallax barrier 302 of FIG. 3B is further modified with a micro offset 310 for a portion of a barrier 302 of the parallax barrier 302 along the second dimension (i.e., X-axis). That is, while a macro offset 308 is applied to the entire barrier rows, a micro offset 310 is applied to a portion of the barriers 302 of each barrier row. The micro offset 310 helps to reduce color banding and moiré effects as described herein. Referring to FIG. 3D, the parallax barrier 302 of FIG. 3C is further modified with an additional guard bar 312. The additional guard bar 312 is added between each barrier row of the parallax barrier 302. The guard bar may help to reduce off-axis cross talk as described herein.

Figure 4:
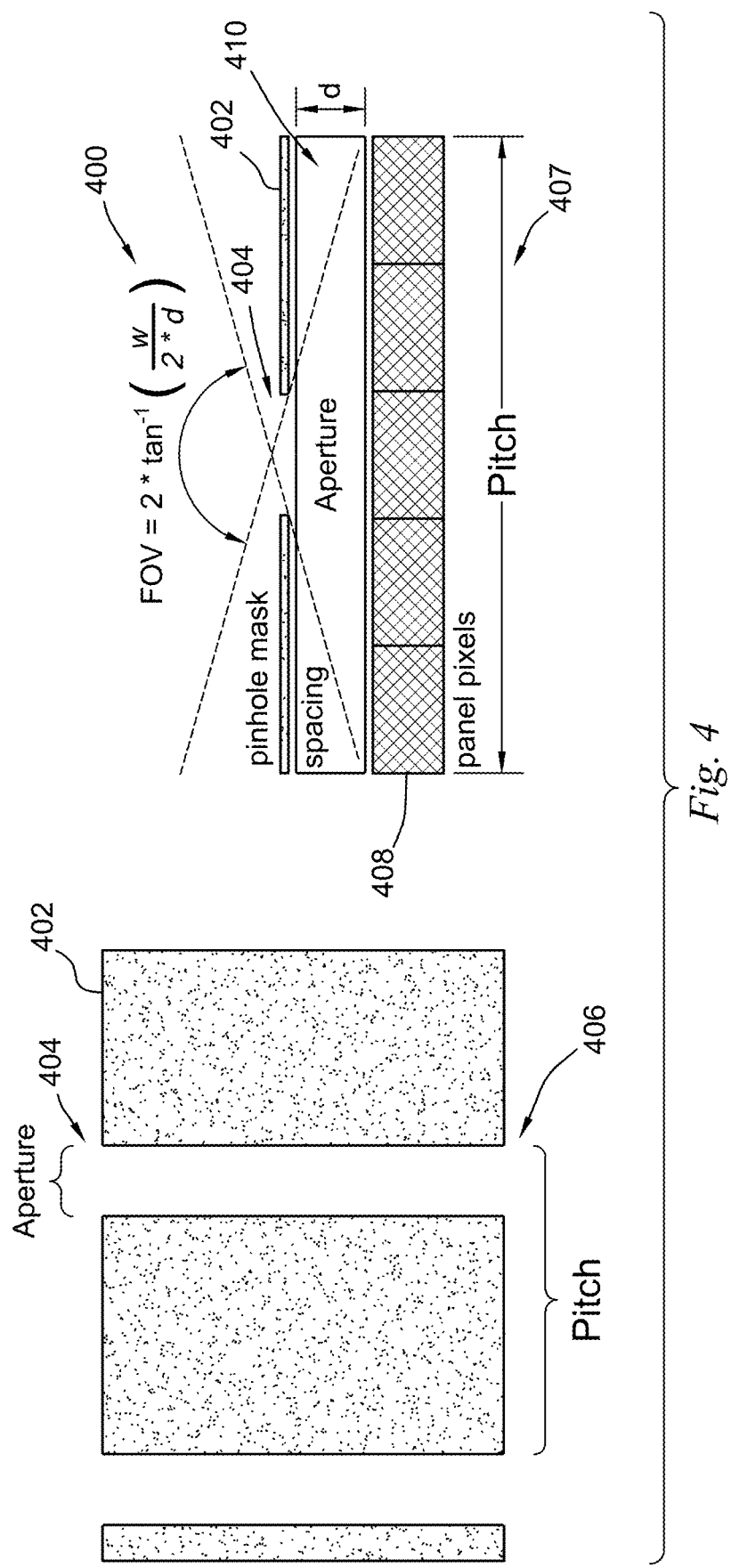
FIG. 4 illustrates an example estimation of field-of-view from properties of a parallax barrier.

FIG. 4 illustrates an example estimation of field-of-view 400 (FOV) from properties of a parallax barrier 402. The parallax barrier 402 may include a plurality of barriers 402 and apertures 404 between each of the barriers 402. A pitch 406 may include the distance of one barrier 402 and a single aperture 404. As shown in the right-side image, a plurality of pixels 408 may be activated to present content through aperture 404. The FOV 400 of the content is based on the properties of the parallax barrier and the display coupled to the parallax barrier. The FOV 400 may be estimated using the image pitch w 407 and a panel thickness d 410. The image pitch w 407 may be defined by the distance corresponding to pixels 408 associated with the content being presented through aperture 404. The panel thickness d 410 may include the thickness of the glass substrate and the polarizer. As shown in FIG. 4, FOV may be estimated by $$FOV = 2*\tan^{-1}\left(\frac{w}{2*d}\right).$$

In particular embodiments, a barrier pitch may be defined as the distance of the barriers 402 and aperture 404 above the image pitch 407. In particular embodiments, a viewing distance may be selected and estimated based on the barrier pitch and the image pitch 407. In particular embodiments, the viewing distance V may be estimated with the equation, $$\frac{P_{barrier}}{P_{image}} = \frac{V}{V + \frac{d}{n}}.$$

$P_{barrier}$ may be the barrier pitch, $P_{image}$ may be the image pitch 407, and n may be the refractive index of medium between barrier and pixels.

Figure 5:
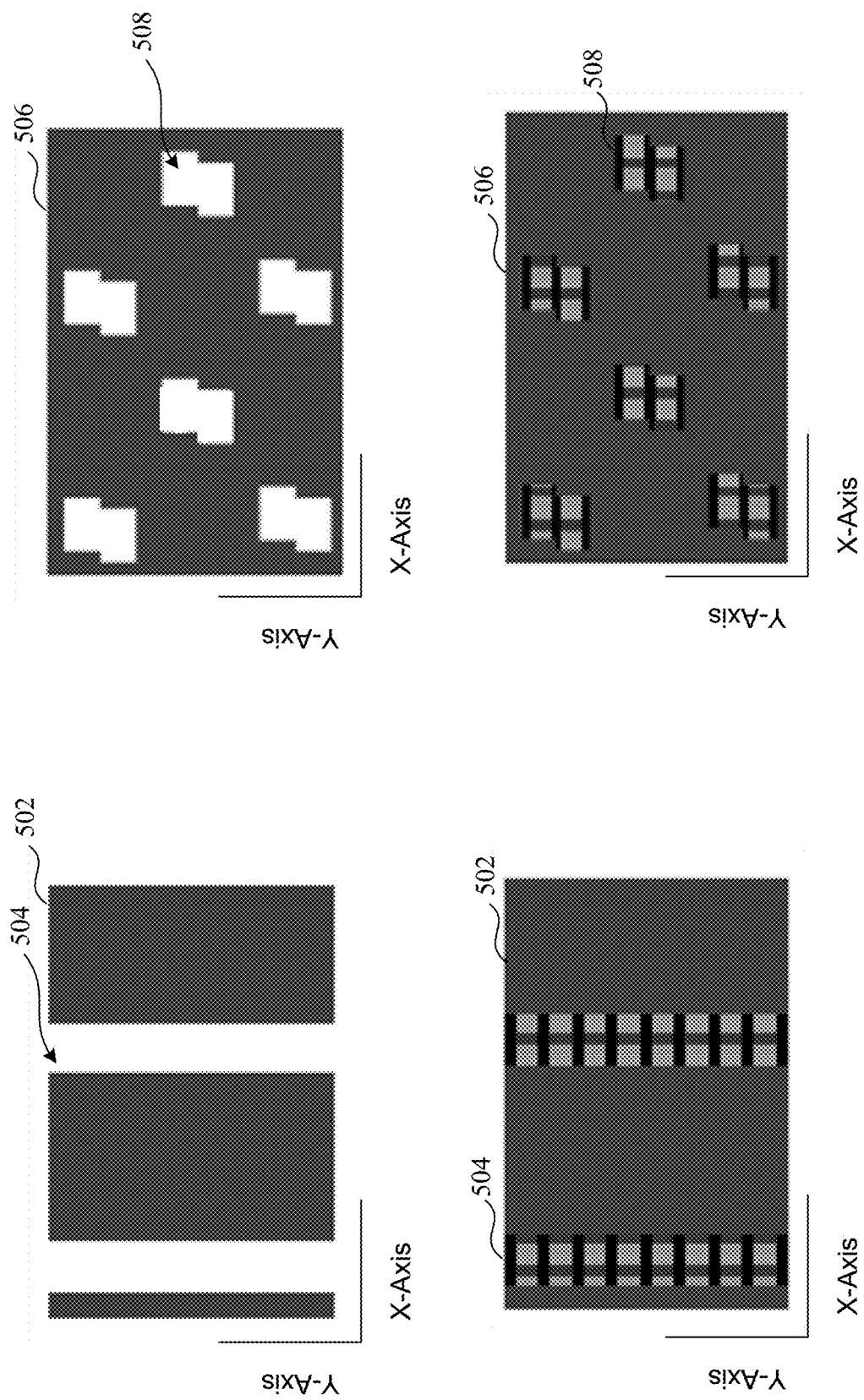
FIG. 5 illustrates example color distributions associated with parallax barriers.

FIG. 5 illustrates example color distributions associated with parallax barriers 502, 506. Parallax barrier 502 may be a standard parallax barrier that includes apertures 504 that run vertically along the parallax barrier 502. In particular embodiments, the parallax barrier 502 may comprise barrier rows that are arrayed (stacked) along a first dimension (i.e., Y-axis), each barrier row comprising multiple barriers arrayed (stacked) along a second dimension (i.e., X-axis). While a section of the parallax barrier 502 is shown with a particular number of barrier rows and barriers, the parallax barrier 502 may have a plurality of barrier rows, each of the barrier rows comprising a plurality of barriers. As described herein, a standard parallax barrier may have the issue of color banding and moiré effects. That is, the visual symmetry of color imbalances within the aperture 508 can cause color banding which would be visible to the user viewing the display coupled to the parallax barrier 502. These color imbalances may include the symmetry of border colors and/or the ratio of subpixel colors available. As an example and not by way of limitation, a user may view two red subpixels, two green subpixels but only one blue subpixel through the aperture 508. This is shown by parallax barrier 502, when pixels are activated and viewed through apertures 504. To reduce the color banding and moiré effects, parallax barrier 506 may have a micro offset for a portion of a barrier as shown through aperture 508. As an example and not by way of limitation, the parallax barrier 506 shown may comprise three barrier rows that are arrayed (stacked) along the first dimension (i.e., Y-axis), each barrier row comprising three barriers arrayed (stacked) along the second dimension (i.e., X-axis). While a section of the parallax barrier 506 is shown with a particular number of barrier rows and barriers, the parallax barrier 506 may have a plurality of barrier rows, each of the barrier rows comprising a plurality of barriers. The parallax barrier 506 may also include a macro offset between each barrier row along the second dimension (i.e., X-axis) and a guard bar. When pixels are activated and viewed through aperture 508, the color is more evenly distributed across the apertures 508 by reducing color banding.

Figure 6A:
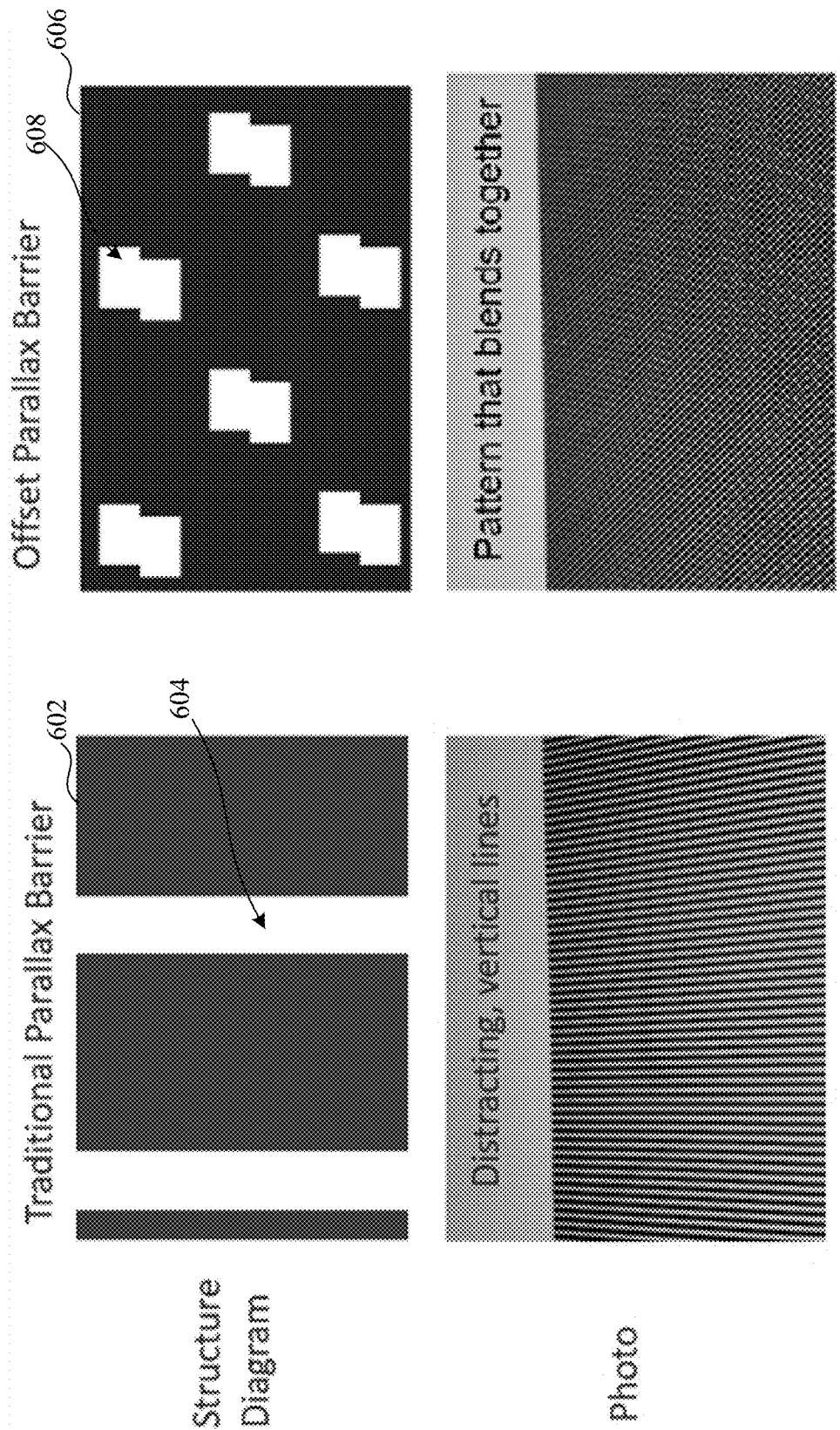
FIGS. 6A-6B illustrate example implementations of parallax barriers.
Figure 6B:
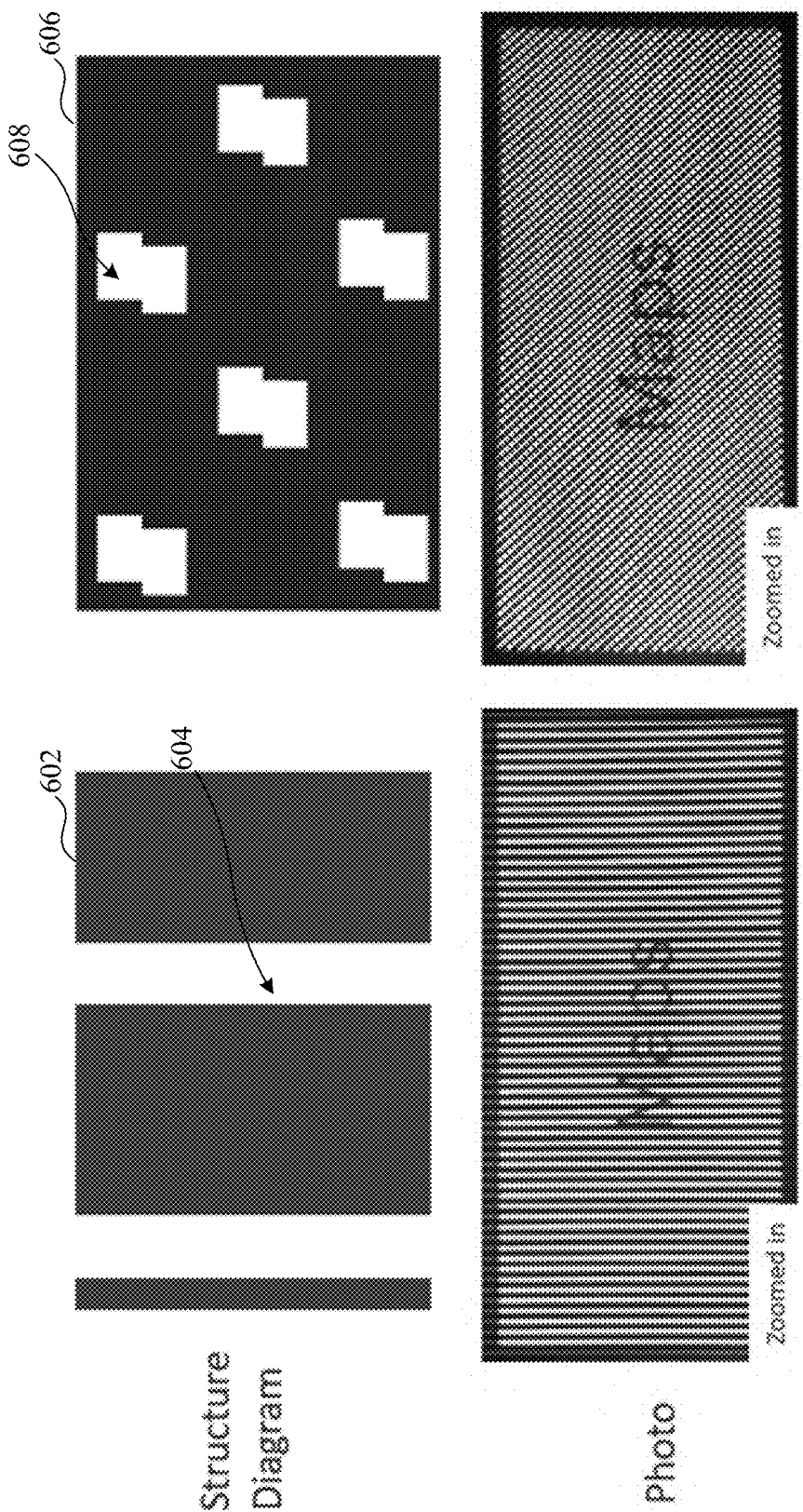

FIGS. 6A-6B illustrate example implementations of parallax barriers. Referring to FIG. 6A, a traditional parallax barrier 602 is shown in comparison to an offset parallax barrier 606 as described herein (e.g., parallax barrier shown in FIG. 3D). The traditional parallax barrier 602 may include apertures 604. The traditional parallax barrier may comprise barrier rows that are arrayed (stacked) along a first dimension (i.e., Y-axis), each barrier row comprising multiple barriers arrayed (stacked) along a second dimension (i.e., X-axis). While a section of the parallax barrier 602 is shown with a particular number of barrier rows and barriers, the parallax barrier 602 may have a plurality of barrier rows, each of the barrier rows comprising a plurality of barriers. As shown in the corresponding photo beneath the traditional parallax barrier 602, vertical lines are visible, which could reduce image quality. The offset parallax barrier 606 may include apertures 608 shaped by the offsets and guard bars as described herein. As an example and not by way of limitation, the offset parallax barrier 606 shown may comprise three barrier rows that are arrayed (stacked) along the first dimension (i.e., Y-axis), each barrier row comprising three barriers arrayed (stacked) along the second dimension (i.e., X-axis). While a section of the offset parallax barrier 606 is shown with a particular number of barrier rows and barriers, the offset parallax barrier 606 may have a plurality of barrier rows, each of the barrier rows comprising a plurality of barriers. As shown in the corresponding photo beneath the offset parallax barrier 606, the pattern blends together. While the parallax barrier still remains partially visible, the resulting pattern is less disruptive to the viewer because the pattern resembles that of pixels, which people have learned to disregard. The pattern that blends together helps improve the image quality of content shown through the parallax barrier 606. Referring to FIG. 6B, the same traditional parallax barrier 602 is shown in comparison to the same offset parallax barrier 602. However, a different photo is shown below each of the parallax barriers 602, 606. As shown in the photo beneath parallax barrier 602, an image including the word "Maps" is shown. The image includes distracting vertical lines that render the word "Maps" unclear. However, the photo below the offset parallax barrier 606 shows improved visual quality as the word "Maps" is clearer. In particular embodiments, the offset parallax barrier 606 may also reduce color banding.

Figure 7:
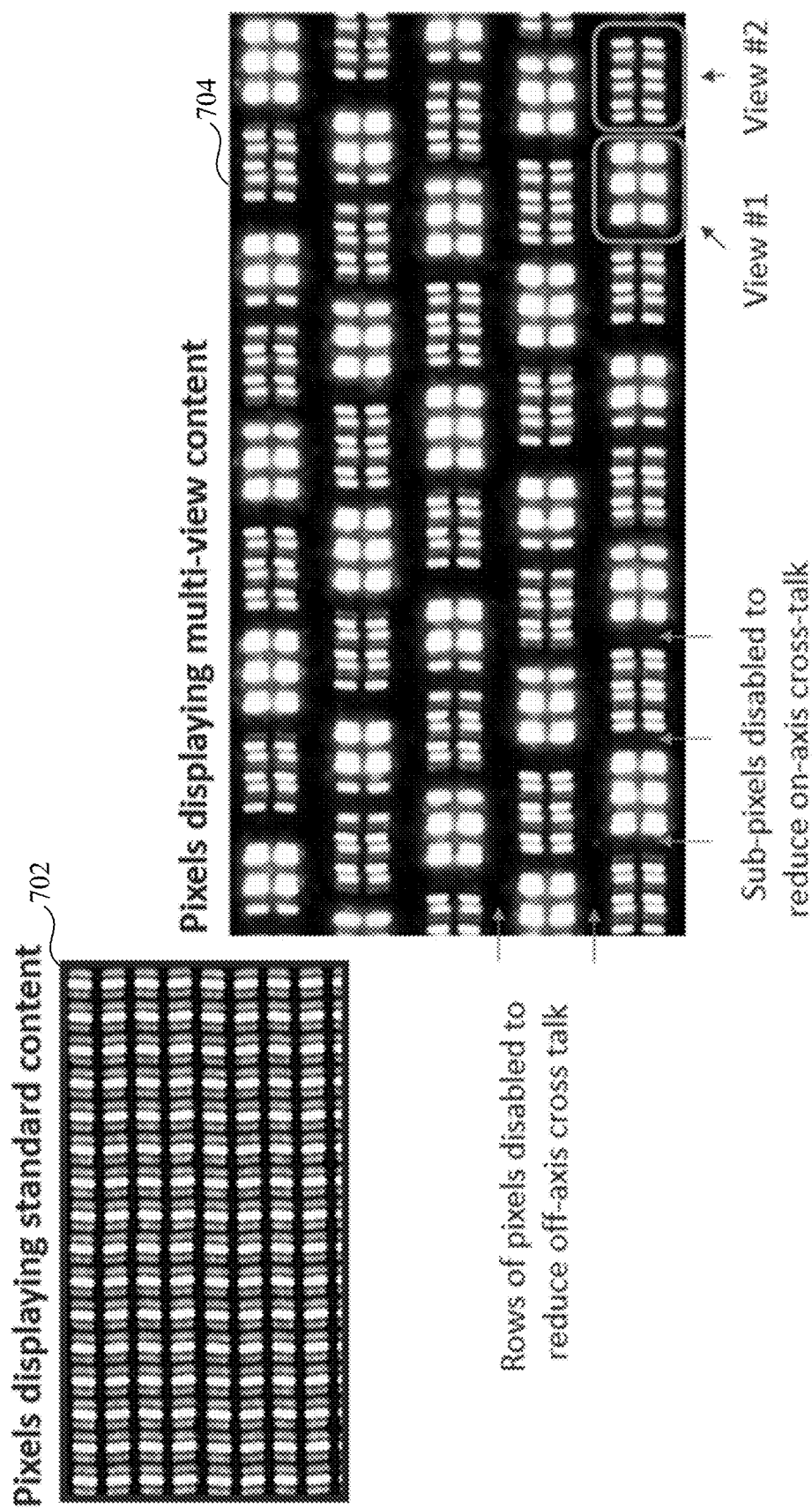
FIG. 7 illustrates a comparison between pixels displaying standard content and pixels displaying multi-view content.

FIG. 7 illustrates a comparison between a display 702 containing pixels displaying standard content and a display 704 containing pixels displaying multi-view content. As shown by display 704, pixels corresponding to view #1 is separated from pixels corresponding to view #2. In particular embodiments, the display 704 may be configured to disable pixels between pixels corresponding to different views. The disablement of pixels is to reduce off-axis cross talk and on-axis cross talk.

Figure 8A:
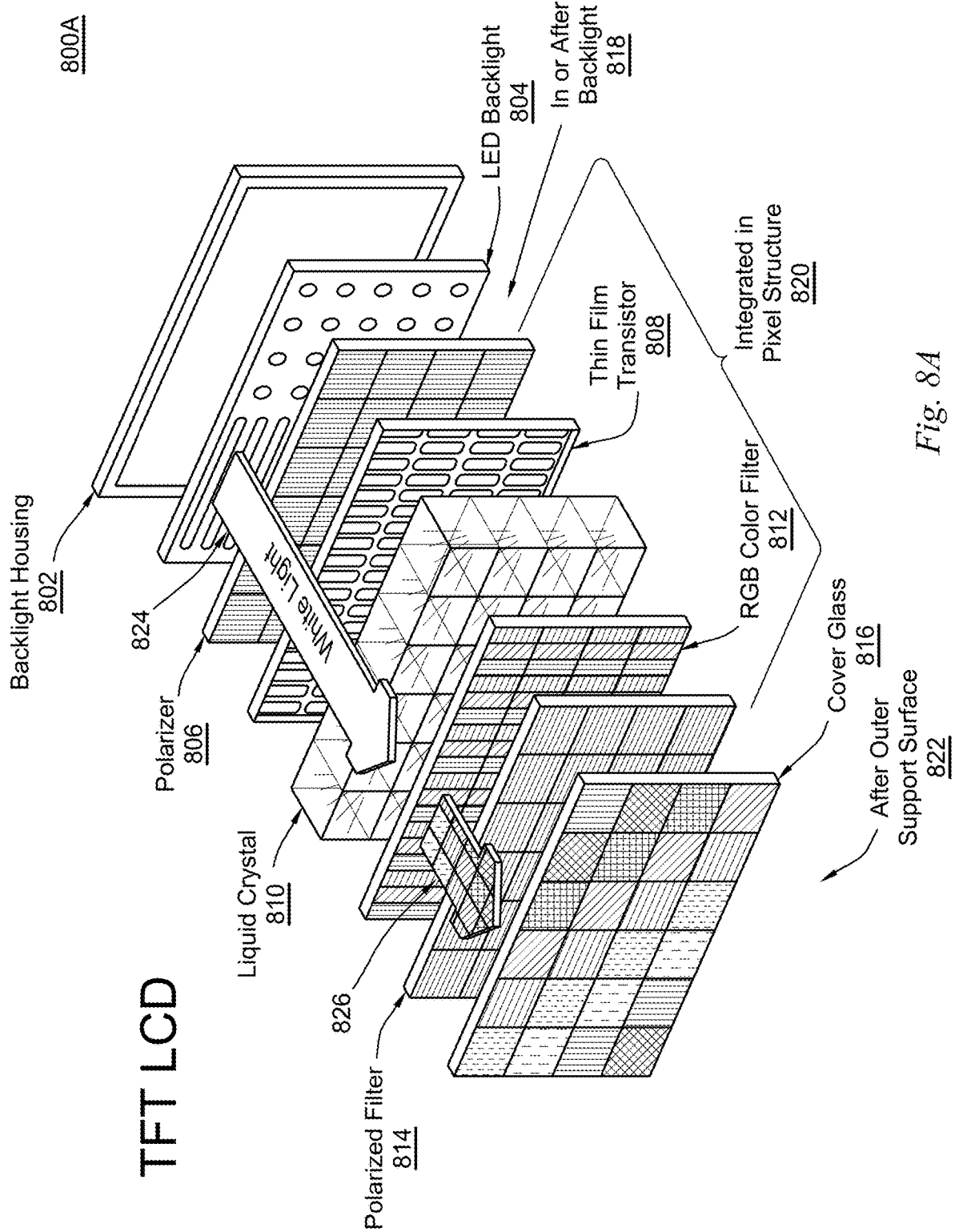
FIGS. 8A-8B illustrate example implementations of the parallax barrier.
Figure 8B:
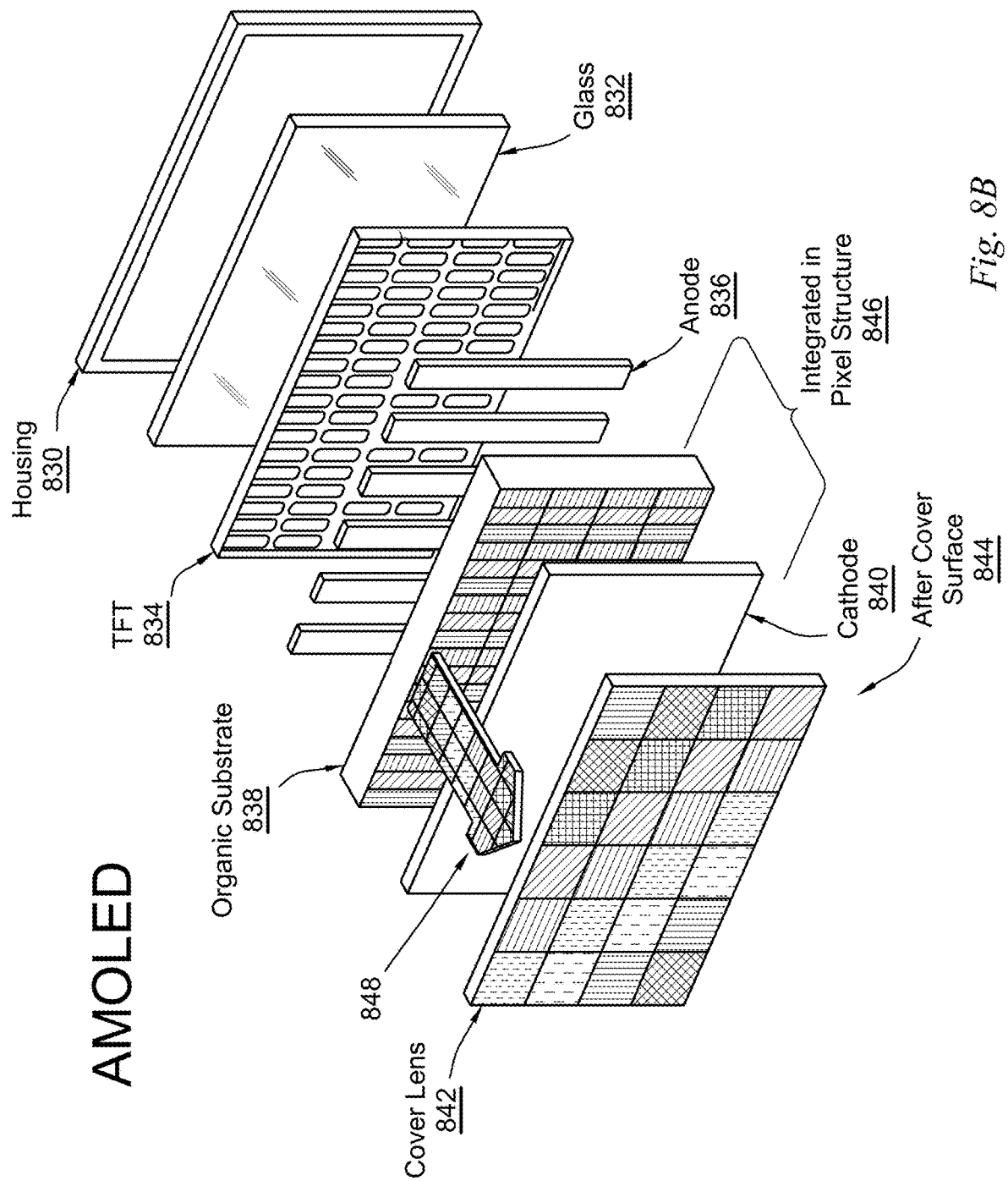

FIGS. 8A-8B illustrate example implementations of the parallax barrier in a display. Referring to FIG. 8A, an example LCD display 800A is shown which may incorporate the parallax barrier as described herein. The LCD display 800A may comprise a plurality of components including a backlight housing 802, a LED backlight 804, a polarizer 806, a thin film transistor 808, a liquid crystal 810, an RGB color filter 812, a polarized filter 814, and a cover glass 816. In particular embodiments, the possible locations that the parallax barrier may be integrated into the LCD display 800A may be in or after the backlight 818, integrated in pixel structure 820, or after outer support surface 822. In particular embodiments, white light 824 may be projected through the different components of the LCD display 800A to turn into RGB light 826. Referring to FIG. 8B, an example OLED display 800B is shown which may incorporate the parallax barrier as described herein. The OLED display 800B may comprise a plurality of components including a housing 830, a glass 832, a thin-film-transistor 834, anode 836, organic substrate 838, cathode 840, and a cover lens 842. In particular embodiments, the possible locations that the parallax barrier may be integrated into the OLED display 800B may be after the cover surface 844 and integrated in the pixel structure 846. In particular embodiments, light 848 may be projected through the cathode 840 and the cover lens 842.

Figure 9:
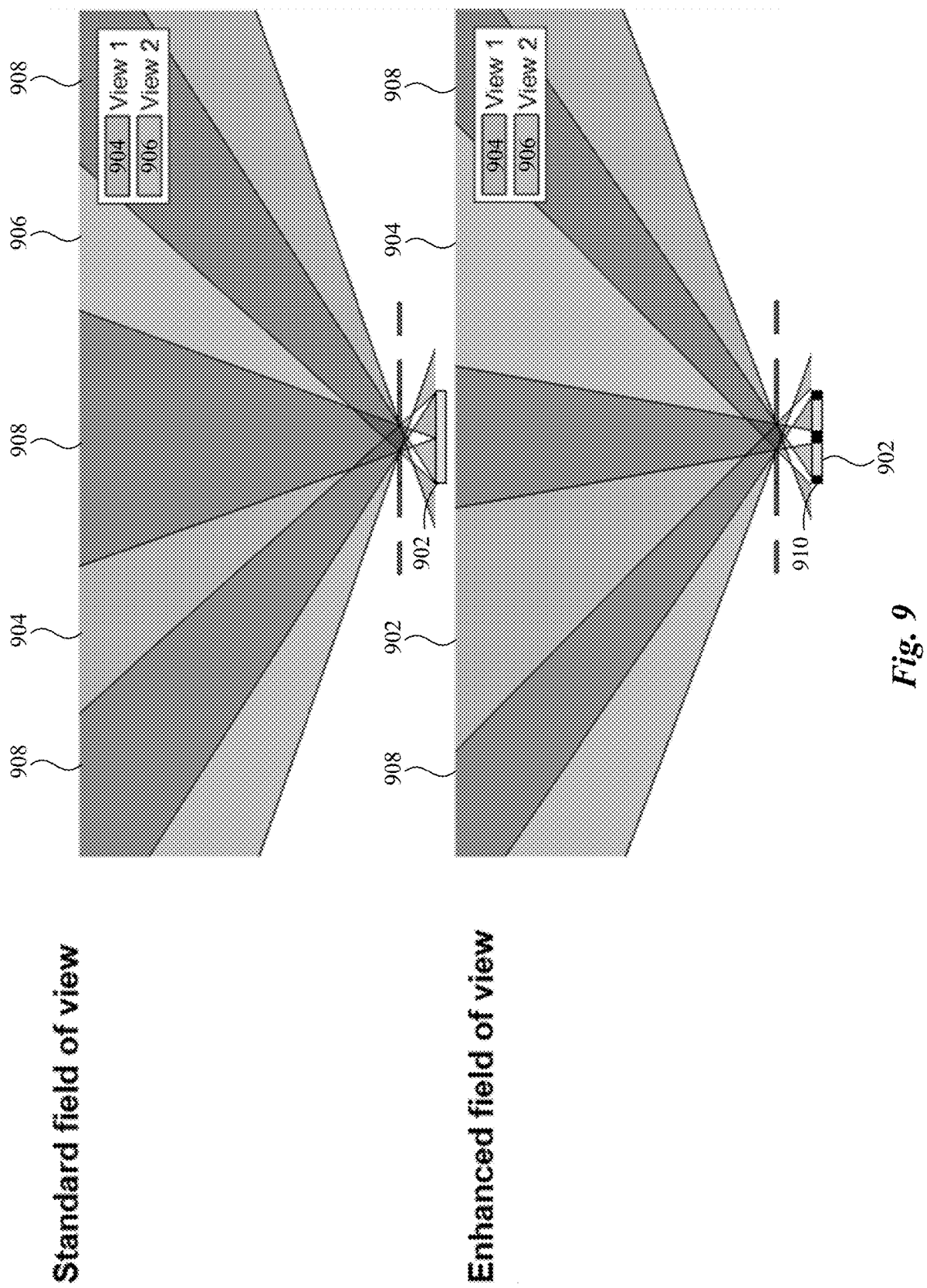
FIG. 9 illustrates a comparison of a field-of-view from two configurations of a multi-view display.

FIG. 9 illustrates a comparison of a field-of-view (FOV) from two configurations of a multi-view display. In particular embodiments, a standard FOV is shown where a multi-view display comprising pixels 902 projects light through the apertures of a parallax barrier. As shown, with the standard FOV, the FOV of the content for view 1 904 and FOV of the content for view 2 906 is shown to be slightly less than the FOV of the cross talk 908. Given that all of the pixels are activated to present both contents for view 1 904 and view 2 906, there is a resulting large area of cross talk 908. In particular embodiments, an enhanced FOV is shown where a multi-view display comprising pixels 902 and disabled pixels 910, where pixels 902 projects light through the apertures of a parallax barrier. In the enhanced FOV, each of the FOV for view 1 904 and FOV for view 2 906 is larger than the FOV of the cross talk 908. By disabling pixels 910 between the two different content, the FOV of the cross talk 908 is reduced.

Figure 10:
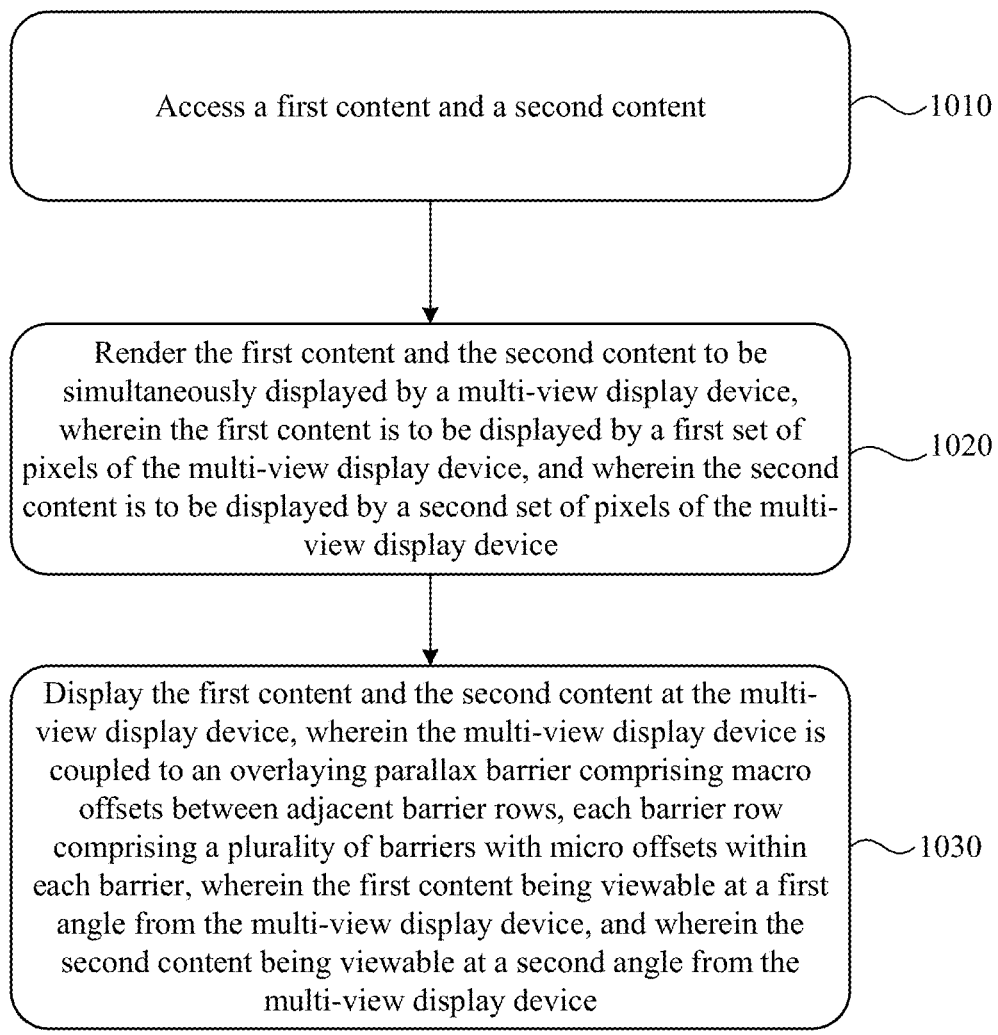
FIG. 10 illustrates an example method for displaying content on a multi-view display device coupled to parallax barrier.

FIG. 10 illustrates is a flow diagram of a method for displaying content on a multi-view display device coupled to a parallax barrier, in accordance with the presently disclosed embodiments. The method 1000 may be performed utilizing one or more processing devices (e.g., apparatus) that may include hardware (e.g., a general purpose processor, a graphic processing unit (GPU), an application-specific integrated circuit (ASIC), a system-on-chip (SoC), a microcontroller, a field-programmable gate array (FPGA), a central processing unit (CPU), an application processor (AP), a visual processing unit (VPU), a neural processing unit (NPU), a neural decision processor (NDP), or any other processing device(s) that may be suitable for processing 2D and 3D image data, software (e.g., instructions running/executing on one or more processors), firmware (e.g., microcode), or some combination thereof.

The method 1000 may begin at step 1010 with the one or more processing devices (e.g., apparatus) accessing a first content and a second content. For example, in particular embodiments, the apparatus may access a movie stored on the apparatus and a video stored on the apparatus. The method 1000 may then continue at step 1020 with the one or more processing devices (e.g., apparatus) rendering the first content and the second content to be displayed simultaneously by a multi-view display device. In particular embodiments, the first content may be displayed by a first set of pixels of the multi-view display device. In particular embodiments, the second content may be displayed by a second set of pixels of the multi-view display device. The method 1000 may then continue at step 1030 with the one or more processing devices (e.g., apparatus) displaying the first content and the second content at the multi-view display device. In particular embodiments, the multi-view display device may be coupled to an overlaying parallax barrier comprising macro offsets between adjacent barrier rows, each barrier row comprising a plurality of barriers with offsets within each barrier. In particular embodiments, the first content may be viewable at a first angle from the multi-view display device. In particular embodiments, the second content may be viewable at a second angle from the multi-view display device. Particular embodiments may repeat one or more steps of the method of FIG. 10, where appropriate. Although this disclosure describes and illustrates particular steps of the method of FIG. 10 as occurring in a particular order, this disclosure contemplates any suitable steps of the method of FIG. 10 occurring in any suitable order. Moreover, although this disclosure describes and illustrates an example method for displaying content on a multi-view display device coupled to a parallax barrier including the particular steps of the method of FIG. 10, this disclosure contemplates any suitable method for displaying content on a multi-view display device coupled to a parallax barrier including any suitable steps, which may include all, some, or none of the steps of the method of FIG. 10, where appropriate. Furthermore, although this disclosure describes and illustrates particular components, devices, or systems carrying out particular steps of the method of FIG. 10, this disclosure contemplates any suitable combination of any suitable components, devices, or systems carrying out any suitable steps of the method of FIG. 10.

Systems and Methods

Figure 11:
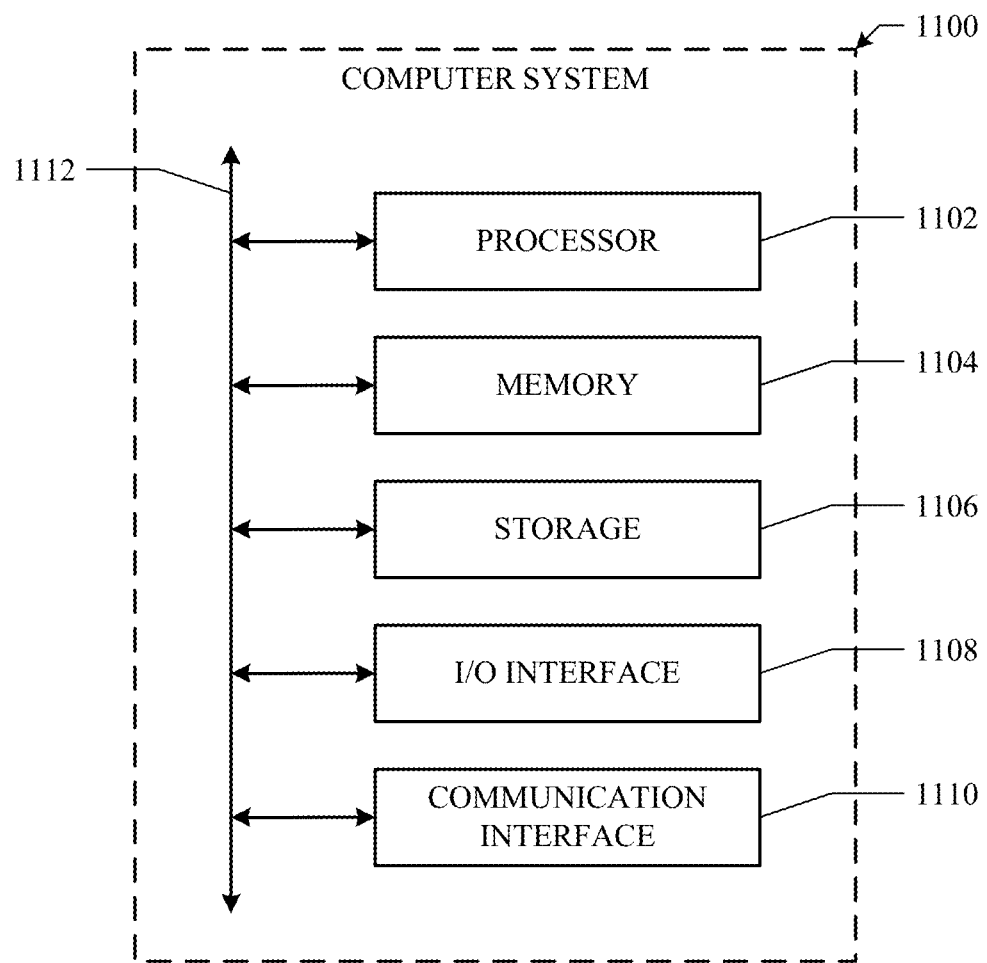
FIG. 11 illustrates an example computer system.

FIG. 11 illustrates an example computer system 1100 that may be utilized to display multi-view content of a multi-view display, in accordance with the presently disclosed embodiments. In particular embodiments, one or more computer systems 1100 perform one or more steps of one or more methods described or illustrated herein. In particular embodiments, one or more computer systems 1100 provide functionality described or illustrated herein. In particular embodiments, software running on one or more computer systems 1100 performs one or more steps of one or more methods described or illustrated herein or provides functionality described or illustrated herein. Particular embodiments include one or more portions of one or more computer systems 1100. Herein, reference to a computer system may encompass a computing device, and vice versa, where appropriate. Moreover, reference to a computer system may encompass one or more computer systems, where appropriate.

This disclosure contemplates any suitable number of computer systems 1100. This disclosure contemplates computer system 1100 taking any suitable physical form. As example and not by way of limitation, computer system 1100 may be an embedded computer system, a system-on-chip (SOC), a single-board computer system (SBC) (e.g., a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1100 may include one or more computer systems 1100; be unitary or distributed; span multiple locations; span multiple machines; span multiple data centers; or reside in a cloud, which may include one or more cloud components in one or more networks.

Where appropriate, one or more computer systems 1100 may perform without substantial spatial or temporal limitation one or more steps of one or more methods described or illustrated herein. As an example, and not by way of limitation, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

In particular embodiments, computer system 1100 includes a processor 1102, memory 1104, storage 1106, an input/output (I/O) interface 1108, a communication interface 1110, and a bus 1112. Although this disclosure describes and illustrates a particular computer system having a particular number of particular components in a particular arrangement, this disclosure contemplates any suitable computer system having any suitable number of any suitable components in any suitable arrangement. In particular embodiments, processor 1102 includes hardware for executing instructions, such as those making up a computer program. As an example, and not by way of limitation, to execute instructions, processor 1102 may retrieve (or fetch) the instructions from an internal register, an internal cache, memory 1104, or storage 1106; decode and execute them; and then write one or more results to an internal register, an internal cache, memory 1104, or storage 1106. In particular embodiments, processor 1102 may include one or more internal caches for data, instructions, or addresses. This disclosure contemplates processor 1102 including any suitable number of any suitable internal caches, where appropriate. As an example, and not by way of limitation, processor 1102 may include one or more instruction caches, one or more data caches, and one or more translation lookaside buffers (TLBs). Instructions in the instruction caches may be copies of instructions in memory 1104 or storage 1106, and the instruction caches may speed up retrieval of those instructions by processor 1102.

Data in the data caches may be copies of data in memory 1104 or storage 1106 for instructions executing at processor 1102 to operate on; the results of previous instructions executed at processor 1102 for access by subsequent instructions executing at processor 1102 or for writing to memory 1104 or storage 1106; or other suitable data. The data caches may speed up read or write operations by processor 1102. The TLBs may speed up virtual-address translation for processor 1102. In particular embodiments, processor 1102 may include one or more internal registers for data, instructions, or addresses. This disclosure contemplates processor 1102 including any suitable number of any suitable internal registers, where appropriate. Where appropriate, processor 1102 may include one or more arithmetic logic units (ALUs); be a multi-core processor; or include one or more processors 1102. Although this disclosure describes and illustrates a particular processor, this disclosure contemplates any suitable processor.

In particular embodiments, memory 1104 includes main memory for storing instructions for processor 1102 to execute or data for processor 1102 to operate on. As an example, and not by way of limitation, computer system 1100 may load instructions from storage 1106 or another source (such as, for example, another computer system 1100) to memory 1104. Processor 1102 may then load the instructions from memory 1104 to an internal register or internal cache. To execute the instructions, processor 1102 may retrieve the instructions from the internal register or internal cache and decode them. During or after execution of the instructions, processor 1102 may write one or more results (which may be intermediate or final results) to the internal register or internal cache. Processor 1102 may then write one or more of those results to memory 1104. In particular embodiments, processor 1102 executes only instructions in one or more internal registers or internal caches or in memory 1104 (as opposed to storage 1106 or elsewhere) and operates only on data in one or more internal registers or internal caches or in memory 1104 (as opposed to storage 1106 or elsewhere).

One or more memory buses (which may each include an address bus and a data bus) may couple processor 1102 to memory 1104. Bus 1112 may include one or more memory buses, as described below. In particular embodiments, one or more memory management units (MMUs) reside between processor 1102 and memory 1104 and facilitate accesses to memory 1104 requested by processor 1102. In particular embodiments, memory 1104 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1104 may include one or more memory devices 1104, where appropriate. Although this disclosure describes and illustrates particular memory, this disclosure contemplates any suitable memory.

In particular embodiments, storage 1106 includes mass storage for data or instructions. As an example, and not by way of limitation, storage 1106 may include a hard disk drive (HDD), a floppy disk drive, flash memory, an optical disc, a magneto-optical disc, magnetic tape, or a Universal Serial Bus (USB) drive or a combination of two or more of these. Storage 1106 may include removable or non-removable (or fixed) media, where appropriate. Storage 1106 may be internal or external to computer system 1100, where appropriate. In particular embodiments, storage 1106 is non-volatile, solid-state memory. In particular embodiments, storage 1106 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1106 taking any suitable physical form. Storage 1106 may include one or more storage control units facilitating communication between processor 1102 and storage 1106, where appropriate. Where appropriate, storage 1106 may include one or more storages 1106. Although this disclosure describes and illustrates particular storage, this disclosure contemplates any suitable storage.

In particular embodiments, I/O interface 1108 includes hardware, software, or both, providing one or more interfaces for communication between computer system 1100 and one or more I/O devices. Computer system 1100 may include one or more of these I/O devices, where appropriate. One or more of these I/O devices may enable communication between a person and computer system 1100. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1106 for them. Where appropriate, I/O interface 1108 may include one or more device or software drivers enabling processor 1102 to drive one or more of these I/O devices. I/O interface 1108 may include one or more I/O interfaces 1106, where appropriate. Although this disclosure describes and illustrates a particular I/O interface, this disclosure contemplates any suitable I/O interface.

In particular embodiments, communication interface 1110 includes hardware, software, or both providing one or more interfaces for communication (such as, for example, packet-based communication) between computer system 1100 and one or more other computer systems 1100 or one or more networks. As an example, and not by way of limitation, communication interface 1110 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1110 for it.

As an example, and not by way of limitation, computer system 1100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1100 may include any suitable communication interface 1110 for any of these networks, where appropriate. Communication interface 1110 may include one or more communication interfaces 1110, where appropriate. Although this disclosure describes and illustrates a particular communication interface, this disclosure contemplates any suitable communication interface.

In particular embodiments, bus 1112 includes hardware, software, or both coupling components of computer system 1100 to each other. As an example, and not by way of limitation, bus 1112 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, High-Definition Multimedia Interface (HDMI), DisplayPort, composite video, or another suitable bus or a combination of two or more of these. Bus 1112 may include one or more buses 1112, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Miscellaneous

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Herein, "automatically" and its derivatives means "without human intervention," unless expressly indicated otherwise or indicated otherwise by context.

The embodiments disclosed herein are only examples, and the scope of this disclosure is not limited to them. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The scope of this disclosure encompasses all changes, substitutions, variations, alterations, and modifications to the example embodiments described or illustrated herein that a person having ordinary skill in the art would comprehend.

The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A apparatus comprising:
    a multi-view display device comprising a plurality of pixels; and
    a parallax barrier overlaying the plurality of pixels, wherein:
        the parallax barrier comprises a plurality of barrier rows arrayed in a first dimension, each barrier row comprising a plurality of barriers arrayed in a second dimension, each barrier being separated from adjacent barriers in the barrier row by an aperture;
        each barrier row being offset from adjacent barrier rows by a macro offset distance in the second dimension; and
        a portion of each barrier being offset by a micro offset distance in the second dimension, wherein the micro offset distance is smaller than the macro offset distance,
    wherein the micro offset distance is configured to cause a distribution of color associated with the plurality of pixels of the multi-view display device for reducing color banding and reducing moiré effects caused by the parallax barrier, wherein the multi-view display device is configured to simultaneously display a first content and a second content, wherein the first content is to be displayed by a first set of pixels of the multi-view display device, wherein the second content is to be displayed by a second set of pixels of the multi-view display device, wherein the first content being viewable at a first angle from the multi-view display device, and wherein the second content being viewable at a second angle from the multi-view display device.

2. The apparatus of claim 1, wherein the distribution of color along at least one border of a first portion of each barrier row is different from the distribution of color along at least one border of a second portion of each barrier row.

3. The apparatus of claim 1, wherein the plurality of barrier rows arrayed in the first dimension and each barrier row comprising the plurality of barriers arrayed in the second dimension creates a pattern of apertures that causes underlying pixels to produce a uniform light throughout the pattern of apertures.

4. The apparatus of claim 1, wherein the macro offset distance is configured to provide spatial blending across a first content and a second content displayed on the multi-view display device.

5. The apparatus of claim 1, wherein the parallax barrier further comprises a plurality of guard barriers in between each of the barrier rows, and wherein the guard barriers extend parallel to the plurality of barrier rows in the second dimension.

6. The apparatus of claim 5, wherein the guard barrier in between each barrier row is configured to reduce off-axis cross talk between underlying pixels in adjacent rows.

7. The apparatus of claim 5, wherein the multi-view display is configured to turn off one or more pixels of the plurality of pixels based on relative locations of the plurality of barriers in each barrier row and the plurality of guard barriers in between each of the barrier rows.

8. A method comprising:
    accessing a first content and a second content;
    rendering the first content and the second content to be simultaneously displayed by a multi-view display device, wherein the first content is to be displayed by a first set of pixels of the multi-view display device, and wherein the second content is to be displayed by a second set of pixels of the multi-view display device; and
    displaying the first content and the second content at the multi-view display device, wherein the multi-view display device is coupled to a parallax barrier overlaying the first set of pixels and the second set of pixels, the parallax barrier comprising macro offsets between adjacent barrier rows arrayed in a first dimension, each barrier row comprising a plurality of barriers arrayed in a second dimension with micro offsets by a micro offset distance in the second dimension between a portion of each barrier, wherein the macro offsets are offsets between the adjacent barrier rows by a macro offset distance in the second dimension, wherein the micro offset distance is smaller than the macro offset distance, wherein each barrier is separated from adjacent barriers in the barrier row by an aperture, wherein the micro offset distance is configured to cause a distribution of color associated with the plurality of pixels of the multi-view display device for reducing color banding and reducing moiré effects caused by the parallax barrier, wherein the first content being viewable at a first angle from the multi-view display device, and wherein the second content being viewable at a second angle from the multi-view display device.

9. The method of claim 8, wherein each barrier row comprising the plurality of barriers arrayed in the second dimension that creates a pattern of apertures in the parallax barrier that causes underlying pixels to produce a uniform light throughout the pattern of apertures.

10. The method of claim 8, wherein the parallax barrier further comprises a plurality of guard barriers in between each of the barrier rows, and wherein the guard barriers extend parallel to the plurality of barrier rows.

11. The method of claim 10, wherein the guard barrier in between each barrier row is configured to reduce off-axis cross talk between underlying pixels in adjacent rows.

12. The method of claim 10, further comprising:
    turning off one or more pixels of the first set of pixels or the second set of pixels based on relative locations of the plurality of barriers in each barrier row and the plurality of guard barriers in between each of the barrier rows.

13. A computer-readable non-transitory storage media comprising instructions executable by a processor to:
access a first content and a second content;
render the first content and the second content to be simultaneously displayed by a multi-view display device, wherein the first content is to be displayed by a first set of pixels of the multi-view display device, and wherein the second content is to be displayed by a second set of pixels of the multi-view display device; and
display the first content and the second content at the multi-view display device, wherein the multi-view display device is coupled to a parallax barrier overlaying the first set of pixels and the second set of pixels, the parallax barrier comprising macro offsets between adjacent barrier rows arrayed in a first dimension, each barrier row comprising a plurality of barriers arrayed in a second dimension with micro offsets by a micro offset distance in the second dimension between a portion of each barrier, wherein the macro offsets are offsets between the adjacent barrier rows by a macro offset distance in the second dimension, wherein the micro offset distance is smaller than the macro offset distance, wherein each barrier is separated from adjacent barriers in the barrier row by an aperture, wherein the micro offset distance is configured to cause a distribution of color associated with the plurality of pixels of the multi-view display device for reducing color banding and reducing moiré effects caused by the parallax barrier, wherein the first content being viewable at a first angle from the multi-view display device, and wherein the second content being viewable at a second angle from the multi-view display device.

14. The media of claim 13, wherein each barrier row comprising the plurality of barriers arrayed in the second dimension that creates a pattern of apertures in the parallax barrier that causes underlying pixels to produce a uniform light throughout the pattern of apertures.

15. The media of claim 13, wherein the parallax barrier further comprises a plurality of guard barriers in between each of the barrier rows, and wherein the guard barriers extend parallel to the plurality of barrier rows.

16. The media of claim 15, wherein the guard barrier in between each barrier row is configured to reduce off-axis cross talk between underlying pixels in adjacent rows.

17. The media of claim 15, herein the instructions are further executable by the processor to:
turn off one or more pixels of the first set of pixels or the second set of pixels based on relative locations of the plurality of barriers in each barrier row and the plurality of guard barriers in between each of the barrier rows.

* * * * *